(12) United States Patent
Miyatake

(10) Patent No.: US 6,335,791 B1
(45) Date of Patent: Jan. 1, 2002

(54) APPARATUS FOR DETECTING POSITIONS OF WAFER AND MASK AND DEFORMATION ERROR DETECTING METHOD

(75) Inventor: Tsutomu Miyatake, Kiyose (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 0 days.

(21) Appl. No.: 09/257,246

(22) Filed: Feb. 25, 1999

(30) Foreign Application Priority Data

Feb. 26, 1998 (JP) .......................................... 10-045509

(51) Int. Cl.[7] ............................................. G01N 11/00
(52) U.S. Cl. ...................................... 356/399; 356/401
(58) Field of Search ................................ 356/399, 401, 356/400; 250/548

(56) References Cited

U.S. PATENT DOCUMENTS

| 4,728,193 A | * | 3/1988 | Barlet et al. ................. 356/356 |
| 5,483,348 A | * | 1/1996 | Komatsu et al. ............. 356/401 |
| 5,572,325 A | * | 11/1996 | Komatsu et al. ............. 356/401 |
| 6,191,858 B1 | * | 2/2001 | Miyatake ..................... 356/399 |

* cited by examiner

Primary Examiner—Frank G. Font
Assistant Examiner—Layla Lauchman
(74) Attorney, Agent, or Firm—Arent Fox Kintner Plotkin & Kahn, PLLC

(57) ABSTRACT

A wafer has first and second wafer marks formed thereon, and a mask has first and second mask marks formed thereon. The first and second mask marks are in correspondence with the first and second wafer marks, the first and second mask marks and the first and second wafer marks constituting first and second alignment mark groups. First and second illumination optical system apply illumination light to the first and second alignment mark groups. First and second observation optical systems obtains images formed by scattered light from the first and second alignment mark groups. Optical axes of the first and second observation optical systems are oblique relative to an exposure surface, and the optical axes vertically projected upon the exposure surface cross at a right angle a straight line interconnecting the first and second wafer marks. A controller detects a size of the wafer and mask in accordance with images obtained by the first and second observation optical systems. High precision position alignment is possible even during exposure without lowering throughput.

14 Claims, 6 Drawing Sheets

APPARATUS FOR DETECTING POSITIONS OF WAFER AND MASK AND DEFORMATION ERROR DETECTING METHOD

This application is based on Japanese patent application HEI 10-45509 filed on Feb. 26, 1998, the whole contents of which are incorporated herein by reference.

BACKGROUND OF THE INVENTION a) Field of the Invention

The present invention relates to a position detecting apparatus which obliquely observes alignment marks of a wafer and a mask and to a wafer/mask deformation error detecting method, and more particularly to a position detecting apparatus and a deformation error detecting method suitable for improving throughput of proximity exposure.

b) Description of the Related Art

A vertical detection method and an oblique detection method are known as a method of detecting the positions of marks on a wafer and a mask by using an aligner having a lens system combined with an image processing system. The vertical detection method observes position detecting marks along a direction perpendicular to the mask surface, and the oblique detection method observes it obliquely.

A chromatic bifocal method is known as a focussing method used by the vertical detection method. The chromatic bifocal method observes a wafer mark formed on a wafer and a mask mark formed on a mask by using light of different wavelengths and chromatic aberrations of the lens system, and focuses the images of the marks on the same flat plane. A wafer mark and a mask mark are hereinafter collectively called an alignment mark. An absolute precision of position detection by the chromatic bifocal method can be made high because the optical resolution of the lens system can be set high in principle.

However, since an alignment mark is observed vertically, a part of the optical system enters the exposure area. Since the optical system shields exposure light, it is necessary to retract the optical system from the exposure area when exposure light is applied. A time required for retracting the optical system lowers throughput. The alignment mark cannot be observed during the exposure, which is one of the reasons of lowering an alignment precision during the exposure.

With the oblique detection method, the optical axis of the optical system is disposed obliquely to the mask surface, and the system can be disposed without shielding the exposure system. It is therefore unnecessary to extract the optical system during the exposure, permitting observation of an alignment mark even during the exposure. Therefore, throughput does not lower and position misalignment during the exposure can be prevented.

A conventional oblique detection method uses oblique focussing in which regular reflection light reflected from the wafer and mask marks is obliquely focussed to detect the images of the marks. An absolute precision of position detection is therefore lowered by image distortion. Furthermore, since regular reflection light is incident upon an observation lens, the optical axis of illumination light cannot coincide with the optical axis of observation light. Since the optical axes of illumination and observation light are required to be separated, if there is even a slight shift between both the axes, the image is distorted and the detection precision is lowered.

The oblique detection method obliquely observes and focuses wafer and mask marks, the absolute precision of position detection is lowered by image distortion. Further, since the optical axes of illumination light and observation light are not coincide, theses axes cannot be disposed coaxially. Therefore, the illumination optical axis is likely to shift from an ideal optical axis. If the illumination optical axis shifts from the ideal optical axis, the image is distorted and correct position detection becomes difficult.

SUMMARY OF THE INVENTION

It is an object of the present invention to provide a position detecting apparatus and method capable of high precision position alignment even during exposure without lowering throughput.

According to one aspect of the present invention, there is provided a position detecting apparatus comprising: holding means for holding a wafer with an exposure surface having first and second wafer marks formed thereon for scattering incidence light for position alignment and a mask with a mask surface having first and second mask marks formed thereon for scattering incidence light for position alignment, the wafer and the mask being faced each other with a predetermined distance being set between the exposure surface and the mask surface, the first and second mask marks being in correspondence with the first and second wafer marks, respectively, and the first and second mask marks and the first and second wafer marks constituting first and second alignment mark groups; first and second illumination optical systems for applying illumination light to the first and second alignment mark groups of the wafer and the mask held by the holding means, along an optical axis which is oblique relative to the exposure surface; first and second observation optical systems having light reception surfaces on which scattered light from the first and second alignment mark groups is focussed, optical axes of the first and second observation optical systems being oblique relative to the exposure surface of the wafer, and the optical axes vertically projected upon the exposure surface both crossing at a right angle a first virtual straight line interconnecting the first and second wafer marks; and control means for controlling to detect a difference of a size between the wafer and the mask in a direction of the first virtual straight line, in accordance with images obtained by the first and second observation optical systems and formed by scattered light from the first and second alignment mark groups.

A relative position of the first wafer and mask marks in the direction of the first virtual straight line can be detected from images obtained by the first observation optical system. In accordance with the detected relative position information, position alignment of the wafer and mask in the first virtual straight line direction can be performed. A relative position of the second wafer and mask marks in the direction of the first virtual straight line can be detected from images obtained by the second observation optical system. In accordance with the detected two relative positions measured by the first and second observation optical systems, a difference of the deformation amount, especially a magnification error, between the wafer and mask in the first virtual straight line direction can be obtained.

According to another aspect of the present invention, there is provided a position detecting method comprising: a holding step of holding a wafer with an exposure surface having first and second wafer marks formed thereon for scattering incidence light for position alignment and a mask with a mask surface having first and second mask marks formed thereon for scattering incidence light for position alignment, the wafer and the mask being faced each other with a predetermined distance being set between the exposure surface and the mask surface, the first and second mask marks being in correspondence with the first and second wafer marks, respectively, and the first and second mask marks and the first and second wafer marks constituting first and second alignment mark groups; an illuminating step of applying illumination light to the first and second alignment mark groups of the wafer and the mask held at the holding step, along an optical axis which is oblique relative to the exposure surface; a focussing step of focussing scattered light from the first and second alignment mark groups on first and second light reception surfaces of first and second observation optical systems by using the first and second observation optic al systems, optical axes of the first and second observation optical systems being oblique relative to the exposure surface of the wafer, and the optical axes vertically projected upon the exposure surface both crossing at a right angle a first virtual straight line interconnecting the first and second wafer marks; and a detecting step of detecting a deformation difference between the wafer and the mask in a direction of the first virtual straight line, in accordance with images focussed by the focussing step and formed by scattered light from the first and second alignment mark groups.

As described above, positions can be detected at a high precision through oblique observation of scattered light from the wafer and mask marks. Since the optical systems are not required to be disposed in the exposure area, the exposure can be performed without retracting the optical systems from the exposure area. It is possible to improve throughput. It is also possible to detect the position shift of patterns to be caused by deformation of the wafer and mask.

DETAILED DESCRIPTION OF THE PREFERRED EMBODIMENTS

Figure 1:
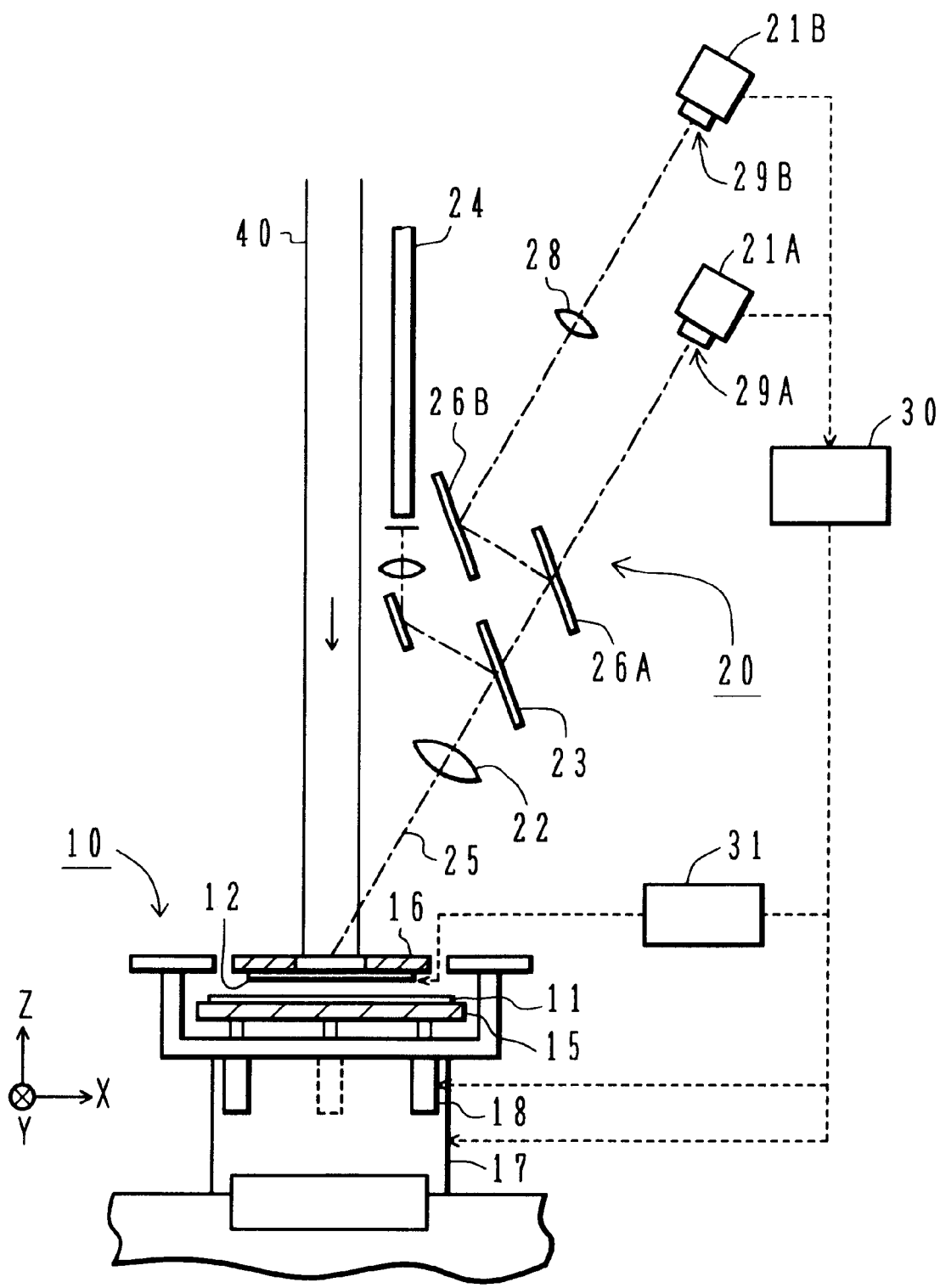
FIG. 1 is a cross sectional view showing the outline of a position detecting apparatus which was proposed earlier and is relevant to an embodiment of the invention.

Prior to describing an embodiment of the invention, a proposal which was made earlier by the prevent inventor and is relevant to the embodiment will be described FIG. 1 is a cross sectional view showing the outline of a position detecting apparatus which was proposed earlier and is relevant to an embodiment of the invention. The position detecting apparatus proposed earlier is constituted of a wafer/mask holder unit 10, an optical system 20, and a controller 30.

The wafer/mask holder unit 10 is constituted of a wafer holder 15, a mask holder 16, and driving mechanisms 17 and 18. When position alignment is performed, a wafer 111 is held on an upper surface of the wafer holder 15 and a mask 112 is held on a lower surface of the mask holder 16. The wafer 11 and mask 12 are disposed generally parallel facing each other with a predetermined gap being set between the upper surface (exposure surface) of the wafer 11 and the lower surface (mask surface) of the mask 12. Wafer marks for position detection are formed on the exposure surface of the wafer 11, and a mask mark for position detection is formed on the mask surface of the mask 12.

The driving mechanism 17 can move either the wafer holder 15 or mask holder 16 to change the relative position of the wafer 11 and mask 12 in an exposure surface area. The driving mechanism 18 can move the wafer holder 15 to change the distance between the exposure surface of the wafer 11 and the mask surface of the mask 12. In an X-Y-Z coordinate system, the X-axis is defined as a direction from the left to the right in FIG. 1, the Y-axis is defined as a direction perpendicular to the drawing sheet from the front surface to the back surface, and the Z-axis is defined as a direction normal to the exposure surface. The driving mechanism 17 adjusts the positional relation between the wafer 11 and mask 12 in the X-axis direction, in the Y-axis direction, and in a rotation direction ($\theta_z$ direction) about the Z-axis. The driving mechanism 18 adjusts the positional relation therebetween in the Z-axis direction and in the rotation (flapping) directions ($\theta_x$ and $\theta_y$ directions) about the X- and Y-axes.

The optical system 20 is constituted of image detectors 21A and 21B, lenses 22 and 28, half mirrors 23, 26A, an optical fiber 24, and mirror 26B. An optical axis 25 of the optical system 20 is parallel to the X-Z plane, and oblique relative to the exposure surface.

Illumination light radiated from the optical fiber 24 is reflected by the half mirror 23, propagates along an optical axis 25, passes through the lens 22, and becomes incident upon the exposure surface.

If the wafer mark and mask mark formed on the wafer 11 and mask 12 have edges or apexes, illumination light is scattered at the edges or apexes. Of the scattered light, light incident upon the lens 22 is converged by the lens 22 and a portion thereof passes through the half mirrors 23 and 26a and is focussed upon the light reception surface 29A of the image detector 21A. A focussing magnification factor at the light reception surface 29A is, for example, 20. Of the scattered light, light reflected by the half mirror 26A is reflected by the mirror 26B, converged by the relay lens 28, and focussed upon the light reception surface 29B of the image detector 21B. A focussing magnification factor at the light reception surface 29B is, for example, 80 to 100. Two observation optical systems having different magnification factors are disposed as described above.

The image detectors 21A and 21B can photoelectrically convert images formed by light scattered from the wafer 11 and mask 12 and focussed on the light reception surfaces 29A and 29B, into image signals which are sent to the controller 30. The controller 30 processes the image signals input from the image detectors 21A and 21B to detect the relative position between the wafer 11 and mask 12. The controller 30 sends a control signal to the driving mechanisms 17 and 18 to make the wafer 11 and mask 12 have a predetermined relative position. In accordance with this control signal, the driving mechanism 17 moves the mask holder 16 in parallel in the X-Y plane and rotates it about the Z-axis direction. In accordance with the control signal, the driving mechanism 18 moves the wafer holder 15 in parallel in the Z-axis direction and finely rotates it about the X- and Y-axes.

Figure 2A:
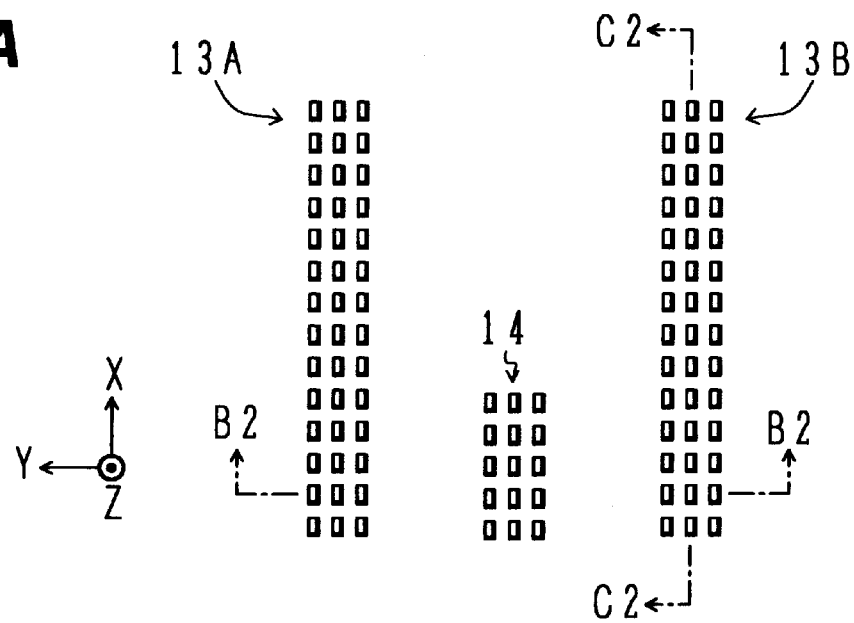
FIG. 2A is a plan view showing wafer marks and a mask mark.

FIG. 2A is a plan view showing an example of a positional relation between position alignment wafer marks 13A and 13B and a position alignment mask mark 14 respectively formed on the wafer 11 and mask 12 shown in FIG. 1. Each of the wafer marks 13A and 13B is formed by disposing rectangular patterns in a matrix form, three patterns in the Y-axis direction and fourteen patterns in the X-axis direction. The other mask pattern 14 is formed by disposing similar rectangular patterns in a matrix form, three patterns in the Y-aids direction and five patterns in the X-axis direction. In the state of position alignment completion, the mask mark 14 is positioned generally at the center of the two wafer marks 13A and 13B.

The longer side of each rectangular pattern of the wafer marks 13A and 13B and mask mark 14 is parallel to the X-axis direction, and the shorter side is parallel to the Y-axis. For example, the length of the longer side of each rectangular pattern is 2 μm and the length of the shorter side is 1 μm. The pitch between rectangular patterns in each mark is, for example, 4 μm both in the X- and Y-axis directions. The distance between the centers of the wafer marks 13A and 13B is 56 μm.

Figure 2B:
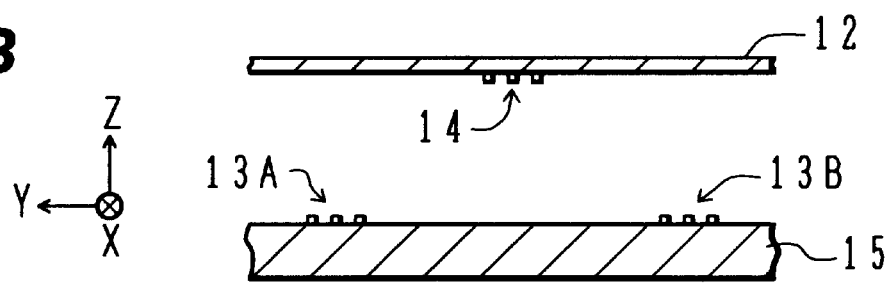
FIGS. 2B and 2C are cross sectional views of the marks.

FIG. 2B is a cross sectional view of the alignment marks taken along one-dot chain line B2—B2 shown in FIG. 2A. The wafer marks 13A and 13B are formed, for example, by patterning an SiN film, a polysilicon film or the like formed on the exposure surface. The mask mark 14 is formed, for example, by patterning a $Ta_4B$ film formed on the mask surface of the membrane 12 made of SiC or the like.

Figure 2C:
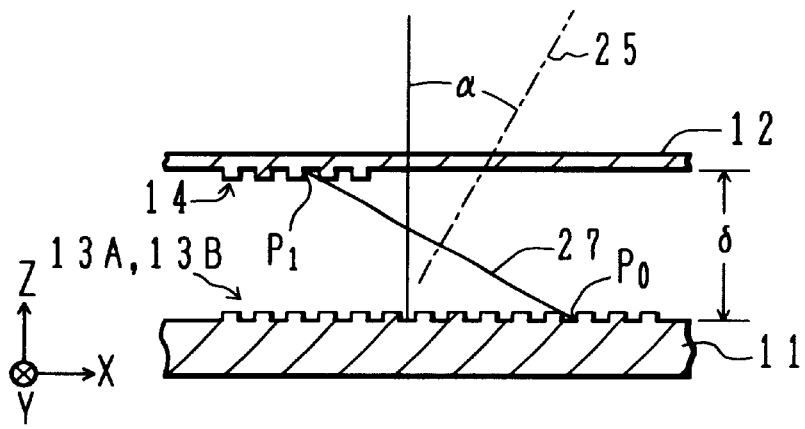

FIG. 2C is a cross sectional view of the alignment marks taken along one-dot chain line C2—C2 shown in FIG. 2A. Illumination light incident upon the wafer marks 13A and 13B and mask mark 14 is scattered at the shorter side edge of each rectangular pattern. Illumination light incident upon an area other than the edges is regularly reflected and does not enter the lens 22 shown in FIG. 1. Therefore, the image detector 21 can detect only light scattered from the edges of the alignment marks.

Scattered light from a plurality of points on a single flat plane perpendicular to the optical axs 25 in the object space of the optical system 20 shown in FIG. 1 is focussed on the light reception surfaces 29A and 29B of the image detectors 21A and 21B at the same time. A flat plane constituted of a set of object points in the object space to be focussed on each light reception surface 29A, 29B is called an "object plane".

Referring to FIG. 2C, among the light scattered from edges of the wafer marks 13A and 13B and mask mark 14, the light scattered from the edges on the object plane 27 is focussed on each light reception surface. However, the light scattered from the edges not on the object plane 27 is not focussed on each light reception surface, and an image formed by light scattered from edges remoter from the object plane becomes more out of focus. Therefore, an image formed by light scattered from the edge of each mark nearest to the object plane becomes most clear, whereas an image formed by light scattered from edges remoter from the object plane becomes more out of focus.

Figure 3:
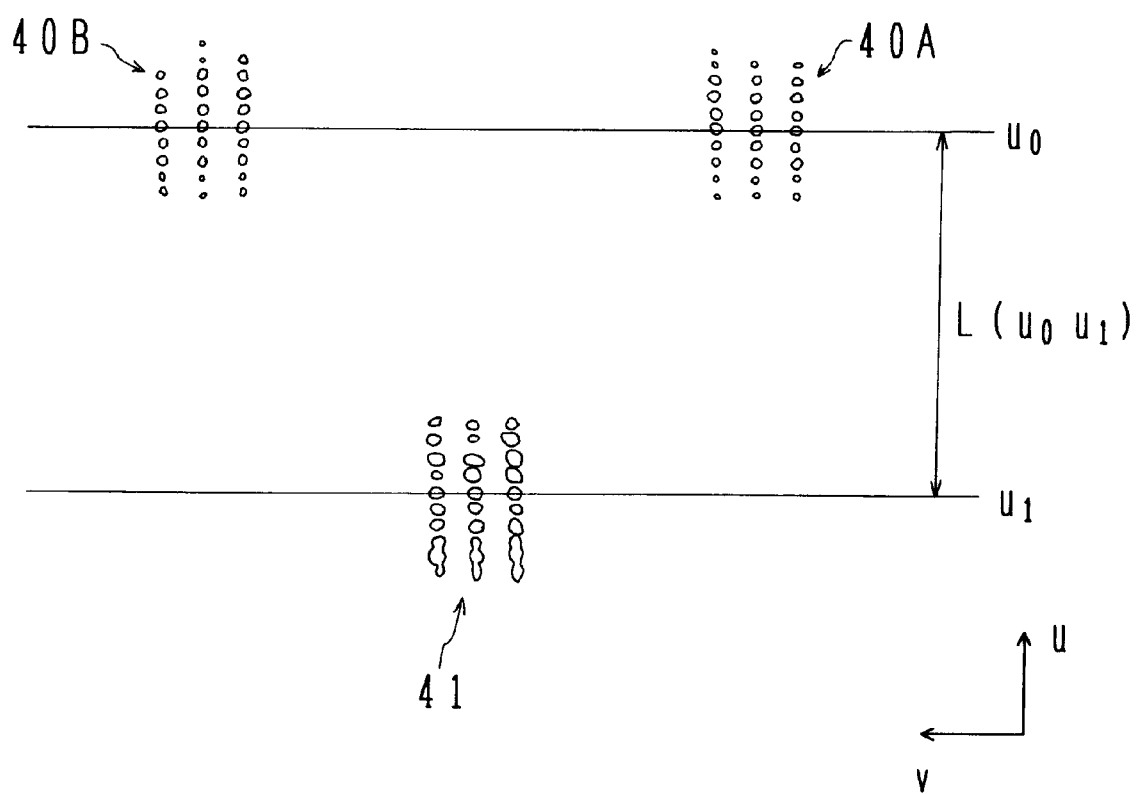
FIG. 3 is a diagram sketched from an image of wafer marks and a mask mark formed by scattered light.

FIG. 3 is a diagram sketched from an image on each light reception surface formed by scattered light from edges of the marks. A u-axis shown in FIG. 3 corresponds to a direction of intersection between the object plane 27 and the X-Z plane shown in FIG. 2C, and a v-axis corresponds to the Y-axis shown in FIG. 2C. Images 40A and 40B formed by scattered light from the wafer marks 13A and 13B appear spaced apart in the v-axis direction, and an image 41 formed by scattered light form the mask mark 14 appears between the images 13A and 13B.

Since scattered light from both front and back edges of each rectangular pattern is detected, two point-like partial images are formed for each rectangular pattern. A partial image formed by scattered light from the edge nearest to the object plane 27 shown in FIG. 2C becomes clear, and a partial image formed by scattered light from the edge remoter from the object plane 27 in the u-axis direction becomes more out of focus. As shown in FIG. 2C, since the observation optical axis 25 is slanted relative to the exposure surface, the position of the images 40A and 40B formed by scattered light from the wafer marks is different in the u-axs direction from the position of the image 41 formed by scattered light from the mask mark.

By moving the wafer holder 15 and mask holder 16 shown in FIG. 1 to set the image 41 formed by scattered light from the mask mark at the center of the two images 40A and 40B in the v-axis direction, it becomes possible to align the positions of the wafer 11 and mask 12 in the Y-axis direction, i.e., in a direction of intersection between the object plane and exposure surface. With the position detecting apparatus shown in FIG. 1, the wafer marks and mask mark are observed obliquely so that it is not necessary to dispose the optical system 20 in an optical path of exposure light 40. It is therefore unnecessary to retract the observation optical system 20 and illumination optical system 23 from an exposure area during exposure. Further, the positions of the wafer and mask can be detected always even while the wafer is exposed after the position alignment. Still further, since the illumination optical axis and observation optical axis are coaxal, there is no axis shift and a stable image can be obtained always.

Figure 4A:
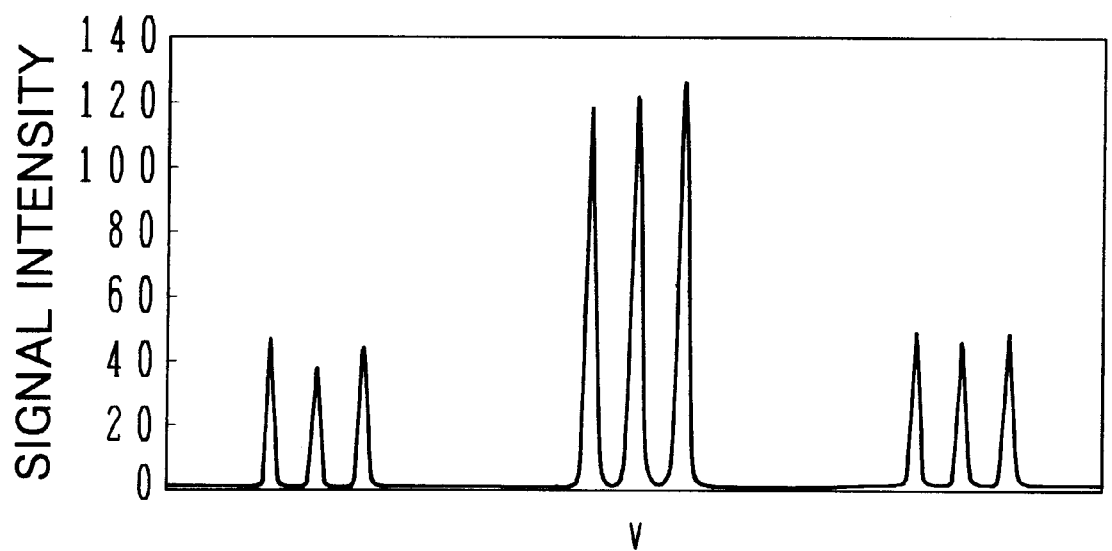
FIGS. 4A and 4B are graphs showing two examples of image signals of images formed by scattered light by using the position detecting apparatus shown in FIG. 1.
Figure 4B:
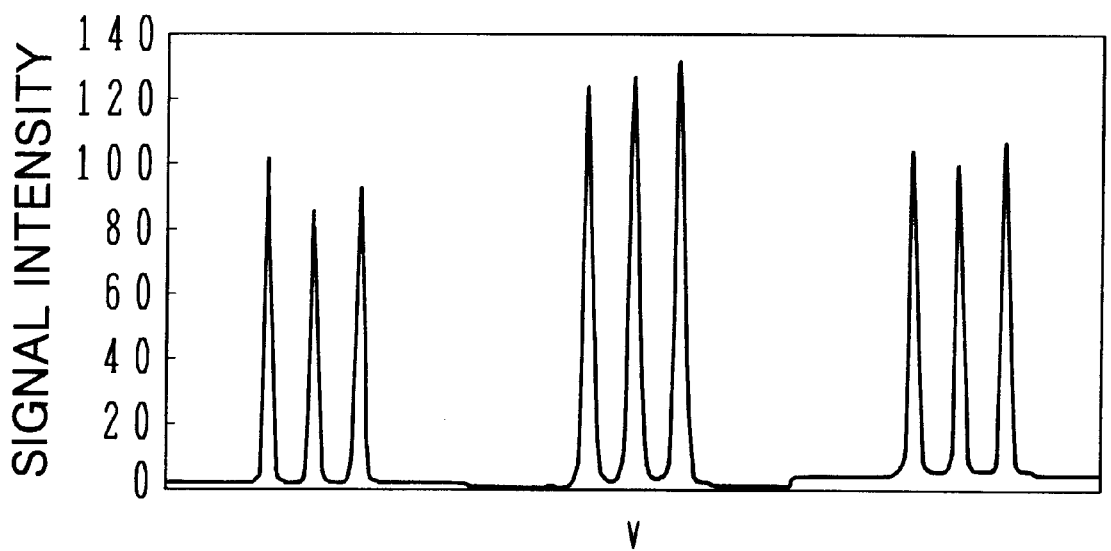

FIGS. 4A and 4B show examples of image signals obtained by the image detector 21. The abscissa corresponds to the u-axis shown in FIG. 3, and the ordinate represents a light intensity. These image signals are obtained by scanning each light reception surface shown in FIG. 3 and synthesizing the image signals corresponding to the scan lines at the highest in-focus states of the images 40A and 40B and image 41.

Image signals shown in FIG. 4A are detected when the wafer marks are made of polysilicon, and those shown in FIG. 4B are detected when the wafer marks are made of SiN. The mask mark is made of $Ta_4B$ in both the cases. As shown in FIGS. 4A and 4B, three peaks corresponding to the mask mark appear generally at the center, and three peaks corresponding to the wafer mark appear on both sides of the mask mark.

An example of the method of detecting a relative position between the mask mark and wafer marks from the waveforms shown in FIGS. 4A and 4B will be briefly described. While the peak waveforms corresponding to the mask mark are moved in the v-axis direction, the correlation coefficients between the mask mark peak waveforms and the wafer mark peak waveforms of each wafer mark are calculated. A motion amount which gives the highest correlation coefficient corresponds to a distance between centers of the wafer mark and mask mark.

By moving the wafer and mask to make equal the distance from the center of the peak waveforms corresponding to the mask mark to the center of the peak waveforms corresponding to each of the wafer marks, position alignment can be performed in the Y-axs direction shown in FIG. 1.

The relative position between the wafer and mask may be obtained through pattern matching between the images of the mask mark and wafer mark by moving in parallel the two-dimensional signals shown in FIG. 3 in the u-axs and v-axs directions. Distances between the images in the u-axis and v-axs directions can be obtained through pattern matching of two-dimensional images.

Next, a method of measuring a distance between a wafer and a mask will be described. Referring to FIG. 3, a position $u_0$ where the images 40A and 40B formed by scattered light from the wafer marks are in the highest in-focus state in the u-axis direction, corresponds to an intersection $P_0$ between the object plane 27 and exposure surface shown in FIG. 2C. Referring again to FIG. 3, a position $u_1$ where the image 41 formed by scattered light from the mask mark is in the highest in-focus state in the u-axis direction, corresponds to an intersection $P_1$ between the object plane 27 and mask surface shown in FIG. 2C. A distance between the positions $u_0$ and $u_1$ can be obtained, for example, through pattern matching of the two-dimensional images shown in FIG. 3.

By representing a length of a line segment $P_0$–$P_1$ as $L(P_0, P_1)$, a distance $\delta$ between the wafer 11 and mask 12 is given by:

$$\delta = L(P_0, P_1) \times \sin(\alpha)$$

where $\alpha$ is an angle between the optical axis 25 and the normal direction to the exposure surface. Therefore, the distance $\delta$ can be calculated from the length of the line segment $P_{0-P1}$ by measuring a distance $L(u_0, u_1)$ between the positions $u_0$ and $u_1$ on the u-axis shown in FIG. 3. In order to calculate the distance $\delta$ correctly, it is preferable to measure the distance between the positions $u_0$ and $u_1$ on the u-axis correctly. From this reason, the shallower the depth of focus of the lens, the better.

Instead of pattern matching between observed images, pattern matching with a prepared standard image may be performed. In this case, standard image signals are stored in advance in a memory which signals are obtained under the conditions that the wafer and mask are disposed so as to satisfy a desired positional relation therebetween. An image of a wafer mark formed by the stored standard image signals is subject to pattern matching with an image of an observed wafer mark, to thereby obtain a shift amount from a wafer reference position. Similarly, an image of a mask mark formed by the stored standard image signals is subject to pattern matching with an image of an observed mask mark, to thereby obtain a shift amount from a mask reference position. From these two shift amounts, the relative position between the wafer and mask can be known.

A precision of position alignment in the Y-axis direction shown in FIG. 1 becomes more severe as integration of semiconductor devices becomes higher. For example, a dynamic RAM having a memory capacity of 16 Gigabits, a position alignment precision in the order of about 12.5 nm is required.

In order to perform position alignment in accordance with the image signals shown in FIGS. 4A and 4B, it is preferable that a relative position alignment of the wafer and mask is in some allowance range of errors. However, it is difficult to hold the wafer 11 on the wafer holder 15 and the mask 12 on the mask holder 16 shown in FIG. 1 in such an allowance range. It is therefore preferable to perform coarse position alignment after the wafer 11 and 12 are held, to obtain such an allowance range.

This coarse position alignment can be performed in accordance with the image signals of images formed on the light reception surface 29A at a lower focussing magnification factor. After the coarse position alignment is performed, fine position alignment having a higher precision is performed in accordance with the image signals of images formed on the light reception surface 29A at a higher focussing magnification factor. By performing the coarse position alignment prior to the fine position alignment, a position alignment precision required when the wafer and mask are held can be mitigated.

As the integration degree becomes high, a distance between the wafer 11 and mask 12 is also required to be maintained in some allowance range. For example, this distance is about 10 to 20 $\mu$m for X-ray exposure of line width of 0.1 $\mu$m, and the allowance is about ±1 $\mu$m. The distance between the wafer and mask is detected in accordance with the image signals of images formed on the light reception surface 29A at the lower focussing magnification factor.

The controller 30 has independently an image signal processing unit for a fine position alignment optical system and another image signal processing unit for a coarse position alignment optical system. If the distance between the wafer and mask is first adjusted by using image signals detected with the fine position alignment optical system, high speed performance of fine position alignment is sacrificed because of the processing ability of the controller 30. This sacrifice of high speed performance of fine position alignment is prevented by adjusting the distance between the wafer and mask first by using the image signals with the coarse position alignment optical system.

In the apparatus shown in FIG. 1, the optical axis of illumination light is coincident with the optical axis of the observation optical system. The two axes are not necessarily required to be coincident if the optical system is configured such that regular reflection light of illumination light does not enter the lens 22 of the observation optical system 20.

Figure 5:
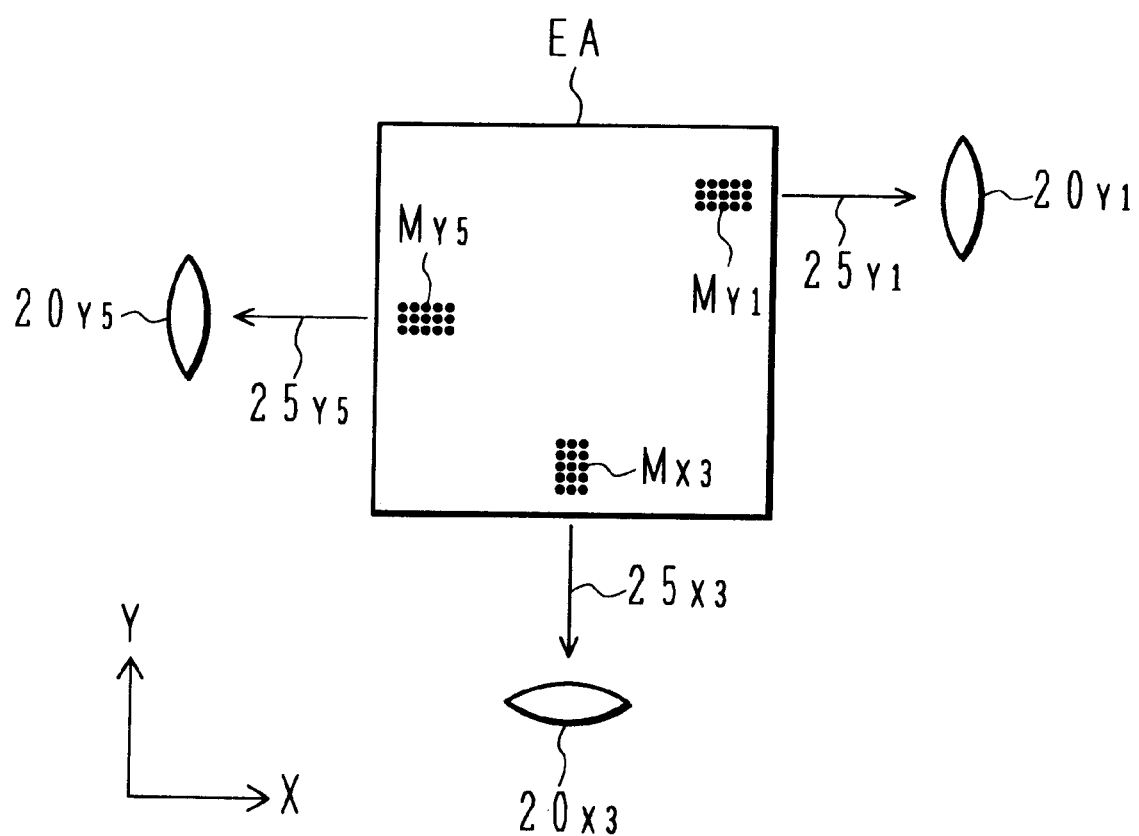
FIG. 5. is a plan view illustrating the positional relation among a wafer, a mask, and an optical system of the position detecting apparatus proposed earlier.

FIG. 5 is a plan view illustrating the positional relation among a wafer, a mask, and an optical system of the position detecting apparatus proposed earlier. In an exposure area EA of the wafer and mask, first, third, and fifth wafer marks for position alignment and first, third, and fifth mask marks for position alignment are disposed. The first wafer mark is in correspondence with the first mask mark, and both the marks constitute a first alignment mark group $M_{y1}$. The third wafer mark is in correspondence with the third mask mark, and both the marks constitute a third alignment mark group $M_{x3}$. The fifth wafer mark is in correspondence with the fifth mask mark, and both the marks constitute a fifth alignment mark group $M_{y5}$.

Each of first, third, and fifth optical systems $20_{y1}$, $20_{x3}$, and $20_{y5}$ has the same structure as that of the optical system 20 shown in FIG. 1. The first and fifth optical systems $20_{y1}$, and $20_{y2}$ are disposed so that their optical axes $25_{y1}$ and $25_{y2}$ vertically projected on the exposure surface (drawing sheet surface of FIG. 5) cross the Y-axis at a right angle. The second optical system $20_{y2}$ is disposed so that its optical axes $25_{y2}$ vertically projected on the exposure surface crosses the X-axis at a right angle. The first, third, and fifth optical systems $20_{y1}$, $20_{x3}$, and $20_{y5}$ obtain images formed by scattered light from the first, third, fifth alignment mark groups $M_{y1}$, $M_{x3}$, and $M_{y5}$.

In accordance with the images obtained by the first optical system $20_{y1}$ by scattered light from the alignment mark group $M_{y1}$, the relative position of the wafer and mask in the Y-axis direction is detected. In accordance with the images obtained by the third optical system $20_{x3}$ by scattered light from the alignment mark group $M_{x3}$ the relative position of the wafer and mask in the X-axis direction is detected. In accordance with two sets of position shift information of the wafer and mask in the Y-axis direction obtained by the first and fifth optical systems $20_{y1}$ and $20_{y5}$, a relative position of the wafer and mask in the rotation direction in the X-Y plane can be detected.

As shown in FIG. 5, by using the three optical systems, information on the positional relation between the wafer and mask can be obtained in the X-axis direction, in the Y-axis direction, and in the rotation direction in the X-Y plane.

A wafer having patterns formed on its surface may be deformed during semiconductor manufacture processes. Mask themselves may also be deformed. A difference between the amount of deformation of the wafer and the mask is generally called magnification error. Such deformation is required to be compensated for, in order to realize high precision position alignment of patterns on the wafer and on the mask. The compensation of the magnification error is called magnification error correction. However, with the position detecting apparatus shown in FIG. 5, position misalignment caused by deformation in the X- and Y-axis directions cannot be detected. In the following, another embodiment of the invention will be described which can detect a position misalignment to be caused by deformation of the wafer and mask.

Figure 6:
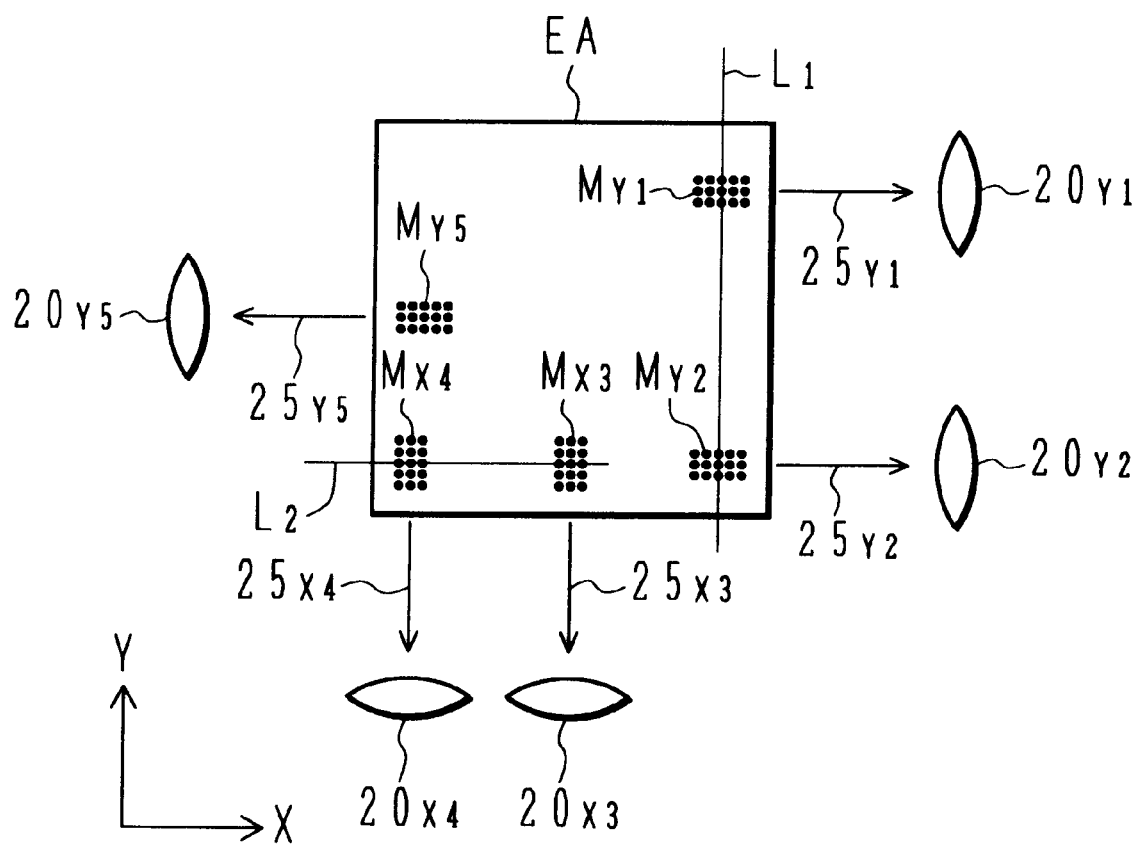
FIG. 6 is a plan view illustrating the positional relation among a wafer, a mask, and optical systems according to another embodiment of the invention.

FIG. 6 is a plan view illustrating the positional relation among a wafer, a mask, and optical systems of the position detecting apparatus according to the embodiment of the invention. In addition to the alignment mark groups $M_{y1}$, $M_3$, and $M_{y5}$ shown in FIG. 5, second and third alignment mark groups $M_{y2}$ and $M_{x4}$ are disposed, and in addition to the optical systems $20_{y1}$, $20_{x3}$, and $20_{y5}$ shown in FIG. 5, second and fourth optical systems $20_{y2}$ and $20_{x4}$ are disposed. Each of the second and fourth optical systems $20_{y2}$ and $20_{x4}$ has the same structure as the optical system shown in FIG. 1.

The first alignment mark group $M_{y1}$ and second alignment mark group $M_{y2}$ are disposed such that a first virtual straight line $L_1$ interconnecting both the groups is parallel to the Y-axis. The third alignment mark group $M_{x3}$ and fourth alignment mark group $M_{x4}$ are disposed such that a second virtual straight line $L_2$ interconnecting both the groups is parallel to the X-axis. The fifth alignment mark group $M_{y5}$ is disposed at a position away from the first virtual straight line $L_1$.

The second optical system $20_{y2}$ is disposed such that its optical axis $25_{y2}$ vertically projected upon the exposure surface crosses the Y-axis at a right angle. The fourth optical system $20_{x4}$ is disposed such that its optical aids $25_{x4}$ vertically projected upon the exposure surface crosses the X-axis at a right angle. The second and fourth optical systems $20_{y2}$ and $20_{x4}$ observe images formed by scattered light from the second and fourth alignment mark groups $M_{y2}$ and $M_4$.

A position shift amount between the first wafer and mask marks obtained by observing the first alignment mark group $M_{y1}$ is represented by $\Delta y_1$, and a position shift amount between the second wafer and mask marks obtained by observing the second alignment mark group $M_{y2}$ is represented by $\Delta y_2$. In this case, a difference of a deformation amount between the wafer and mask in the Y-axis direction can be obtained from $\Delta y_1 - \Delta y_2$. Similarly, by observing the third and fourth alignment mark groups $M_{x3}$ and $M_{x4}$, a difference of a deformation amount between the wafer and mask in the X-axis direction can be obtained.

By representing as $\Delta y_5$ a position shift between the fifth wafer mark and mask mark obtained through observation of the fifth alignment mark group $M_{y5}$, a positional relation between the wafer and mask in the rotation direction in the X-Y plane can be known from $\Delta y_1 - \Delta y_5$.

Referring to FIG. 1, the controller 30 performs the above-described calculations in accordance with the images obtained by the optical systems to thereby obtain differences of the deformation amount between the wafer and mask in the X- and Y-axs directions. In accordance with the differences of the deformation amount, a deformation amount compensation signal is sent to a deformation compensation means 31.

The deformation compensating means 31 deforms the mask 12 in the X- and Y-axis directions to compensate for a difference of the deformation amount between the wafer and mask. For example, the deformation compensating means 31 thermally deforms the mask by locally heating it. By properly selecting the heated area, the deformation can be made generally independently in the X- and Y-axis directions (refer to Shimazu, et. al., "Proposal of Alignment through X-ray Mask Thermal Deformation Compensation", The Japan Society of Applied Physics, 1997, Autumn, Scientific Lecture Submission Papers, Lecture No. 40-ZL-8, p. 700). External stress may be applied to the mask to deform it.

In the apparatus shown in FIG. 6, the first and second virtual straight lines $L_1$ and $L_2$ cross at a right angle. The lines are not necessarily required to cross at a right angle, but they may be cross at a different angle.

The present invention has been described in connection with the preferred embodiments. The invention is not limited only to the above embodiments. It is apparent that various modifications, improvements, combinations, and the like can be made by those skilled in the art.

What is claimed is:

1. A position detecting apparatus comprising:

holding means for holding a wafer with an exposure surface having first and second wafer marks formed thereon for scattering incidence light for position alignment and a mask with a mask surface having first and second mask marks formed thereon for scattering incidence light for position alignment, the wafer and the mask being faced each other with a predetermined distance being set between the exposure surface and the mask surface, the first and second mask marks being in correspondence with the first and second wafer marks, respectively, and the first and second mask marks and the first and second wafer marks constituting first and second alignment mark groups;

first and second illumination optical systems for applying illumination light to the first and second alignment mark groups of the wafer and the mask held by said holding means, along an optical axis which is oblique relative to the exposure surface;

first and second observation optical systems having light reception surfaces on which scattered light from the first and second alignment mark groups is focussed, optical axes of said first and second observation optical systems being oblique relative to the exposure surface of the wafer, and the optical axes vertically projected upon the exposure surface both crossing at a right angle a first virtual straight line interconnecting the first and second wafer marks; and control means for controlling to detect a difference of a size between the wafer and the mask in a direction of the first virtual straight line, in accordance with images obtained by said first and second observation optical systems and formed by scattered light from the first and second alignment mark groups.

2. A position detecting apparatus according to claim 1, wherein said first and second illumination optical systems and said first and second observation optical systems are disposed such that regular reflection light of illumination light from said first and second illumination optical systems at surfaces of the wafer and the mask does not reach the light reception surfaces of said first and second observation optical systems.

3. A position detecting apparatus according to claim 1, further comprising first deformation compensating means for deforming the mask in a direction of the first virtual straight line in order to compensate for the difference of the size in the direction of the first virtual straight line detected by said control means.

4. A position detecting apparatus according to claim 2, further comprising first deformation compensating means for deforming the mask in a direction of the first virtual straight line in order to compensate for the difference of the size in the direction of the first virtual straight line detected by said control means.

5. A position detecting apparatus according to claim 1, wherein:
   the wafer further has third and fourth wafer marks for scattering incidence light for position alignment, the third and fourth wafer marks being formed on the exposure surface and disposed at different positions on a second virtual straight line crossing the first virtual straight line;
   the mask further has third and fourth mask marks for scattering incidence light for position alignment, the third and fourth mask marks being formed on the mask surface, the wafer and the mask being faced each other with a predetermined distance being set between the exposure surface and the mask surface, the first and second mask marks being set in correspondence with the first and second wafer marks, respectively, the third and fourth mask marks being set in correspondence with the third and fourth wafer marks, respectively, and the third and fourth mask marks and the third and fourth wafer marks constituting third and fourth alignment mark groups;
   the position detecting apparatus farther comprises:
      third and fourth illumination optical systems for applying illumination light to the third and fourth alignment mark groups of the wafer and the mask held by said holding means, along the optical axis which is oblique relative to the exposure surface; and
      third and fourth observation optical systems having light reception surfaces on which scattered light from the third and fourth alignment mark groups is focussed, optical axes of said third and fourth observation optical systems being oblique relative to the exposure surface of the wafer, and the optical axes vertically projected upon the exposure surface both crossing at a right angle the second virtual straight line,
      wherein said control means controls to detect a difference of a size between the wafer and the mask in a direction of the second virtual straight line, in accordance with images obtained by said third and fourth observation optical systems and formed by scattered light from the third and fourth alignment mark groups.

6. A position detecting apparatus according to claim 2, wherein:
   the wafer further has third and fourth wafer marks for scattering incidence light for position alignment, the third and fourth wafer marks being formed on the exposure surface and disposed at different positions on a second virtual straight line crossing the first virtual straight line;
   the mask further has third and fourth mask marks for scattering incidence light for position alignment, the third and fourth mask marks being formed on the mask surface, the wafer and the mask being faced each other with a predetermined distance being set between the exposure surface and the mask surface, the first and second mask marks being set in correspondence with the first and second wafer marks, respectively, the third and fourth mask marks being set in correspondence with the third and fourth wafer marks, respectively, and the third and fourth mask marks and the third and fourth wafer marks constituting third and fourth alignment mark groups;
   the position detecting apparatus further comprises:
      third and fourth illumination optical systems for applying illumination light to the third and fourth alignment mark groups of the wafer and the mask held by said holding means, along the optical axis which is oblique relative to the exposure surface; and
      third and fourth observation optical systems having light reception surfaces on which scattered light from the third and fourth alignment mark groups is focussed, optical axes of said third and fourth observation optical systems being oblique relative to the exposure surface of the wafer, and the optical axes vertically projected upon the exposure surface both crossing at a right angle the second virtual straight line,
      wherein said control means controls to detect a difference of a size between the wafer and the mask in a direction of the second virtual straight line, in accordance with images obtained by said third and fourth observation optical systems and formed by scattered light from the third and fourth alignment mark groups.

7. A position detecting apparatus according to claim 5, wherein said third and fourth illumination optical systems and said third and fourth observation optical systems are disposed such that regular reflection light of illumination light from said third and fourth illumination optical systems at surfaces of the wafer and the mask does not reach the light reception surfaces of said third and fourth observation optical systems.

8. A position detecting apparatus according to claim 6, wherein said third and fourth illumination optical systems and said third and fourth observation optical systems are disposed such that regular reflection light of illumination light from said third and fourth illumination optical systems at surfaces of the wafer and the mask does not reach the light reception surfaces of said third and fourth observation optical systems.

9. A position detecting apparatus according to claim 5, further comprising second deformation compensating means for deforming the mask in a direction of the second virtual straight line in order to compensate for the difference of the size in the direction of the second virtual straight line detected by said control means.

10. A position detecting apparatus according to claim 6, further comprising second deformation compensating means for deforming the mask in a direction of the second virtual straight line in order to compensate for the difference of the size in the direction of the second virtual straight line detected by said control means.

11. A position detecting apparatus according to claim 5, wherein the first and second virtual straight lines cross each other at a right angle.

12. A position detecting apparatus according to claim 1, wherein:

the wafer further has a fifth wafer mark for scattering incidence light for position alignment, the fifth wafer mark being formed on the exposure surface and disposed at a position away from the first virtual straight line;

the mask further has a fifth mask mark for scattering incidence light for position alignment, the fifth mask mark being formed on the mask surface, the wafer and the mask being faced each other with a predetermined distance being set between the exposure surface and the mask surface, the first and second mask marks being set in correspondence with the first and second wafer marks, respectively, the fifth mask mark being set in correspondence with the fifth wafer mark, and the fifth mask mark and the fifth wafer mark constituting a fifth alignment mark group;

the position detecting apparatus further comprises:

a fifth illumination optical system for applying illumination light to the fifth alignment mark group of the wafer and the mask held by said holding means, along the optical axis which is oblique relative to the exposure surface; and a fifth observation optical system having a light reception surface on which scattered light from the fifth alignment mark group is focussed, an optical axis of said fifth observation optical system being oblique relative to the exposure surface of the wafer, and the optical axis vertically projected upon the exposure surface crossing at a right angle the first virtual straight line, wherein said control means controls to detect a relative position of the wafer and the mask in a rotation direction in a plane of the exposure surface, in accordance with images obtained by said first and fifth observation optical systems and formed by scattered light from the first and fifth alignment mark groups.

13. A position detecting apparatus according to claim 12, wherein said fifth illumination optical system and said fifth observation optical system are disposed such that regular reflection light of illumination light from said fifth illumination optical system at surfaces of the wafer and the mask does not reach the light reception surfaces of said fifth observation optical system.

14. A position detecting method comprising:

a holding step of holding a wafer with an exposure surface having first and second wafer marks formed thereon for scattering incidence light for position alignment and a mask with a mask surface having first and second mask marks formed thereon for scattering incidence light for position alignment, the wafer and the mask being faced each other with a predetermined distance being set between the exposure surface and the mask surface, the first and second mask marks being in correspondence with the first and second wafer marks, respectively, and the first and second mask marks and the first and second wafer marks constituting first and second alignment mark groups;

an illuminating step of applying illumination light to the first and second alignment mark groups of the wafer and the mask held at said holding step, along an optical axs which is oblique relative to the exposure surface;

a focussing step of focussing scattered light from the first and second alignment mark groups on first and second light reception surfaces of first and second observation optical systems by using the first and second observation optical systems, optical axes of the first and second observation optical systems being oblique relative to the exposure surface of the wafer, and the optical axes vertically projected upon the exposure surface both crossing at a right angle a first virtual straight line interconnecting the first and second wafer marks; and a detecting step of detecting a deformation difference between the wafer and the mask in a direction of the first virtual straight line, in accordance with images focussed by said focussing step and formed by scattered light from the first and second alignment mark groups.

\* \* \* \* \*